United States Patent
Park et al.

(10) Patent No.: US 9,318,589 B2
(45) Date of Patent: Apr. 19, 2016

(54) INSULATED GATE BIPOLAR TRANSISTOR

(71) Applicant: SAMSUNG ELECTRO-MECHANICS CO., LTD., Suwon, Gyunggi-do (KR)

(72) Inventors: Jaehoon Park, Gyunggi-do (KR); Chang Su Jang, Gyunggi (KR); In Hyuk Song, Gyunggi-do (KR); Kee Ju Um, Gyunggi-do (KR); Dong Soo Seo, Gyunggi-do (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 0 days.

(21) Appl. No.: 13/751,916

(22) Filed: Jan. 28, 2013

(65) Prior Publication Data
US 2014/0138736 A1    May 22, 2014

(30) Foreign Application Priority Data
Nov. 21, 2012  (KR) .................. 10-2012-0132534

(51) Int. Cl.
*H01L 29/739*   (2006.01)
*H01L 29/10*    (2006.01)

(52) U.S. Cl.
CPC ........ *H01L 29/7397* (2013.01); *H01L 29/1095* (2013.01)

(58) Field of Classification Search
CPC ..... H01L 29/739; H01L 29/78; H01L 29/423; H01L 29/94; H01L 29/745
USPC ......... 257/331, 129, 144, 152, 333, 341, 409, 257/E21.384, E29.021, E29.201, 288, 330, 257/566, 588, 133, 137, 154, 165; 438/242, 438/243
See application file for complete search history.

(56) References Cited

U.S. PATENT DOCUMENTS

| 5,894,149 A | * | 4/1999 | Uenishi | ............... H01L 29/0653 257/129 |
| 2006/0006409 A1 | * | 1/2006 | Yamaguchi et al. | .......... 257/133 |

(Continued)

FOREIGN PATENT DOCUMENTS

| CN | 101675525 A | 3/2010 |
| JP | 6-188423 A | 7/1994 |

(Continued)

OTHER PUBLICATIONS

Korean Office Action issued in Korean Application No. 10-2012-0132534 dated Sep. 5, 2013, with English translation, 16 pages.
Chinese Office Action issued Dec. 22, 2015, in Chinese Application No. 201310042628.3.

*Primary Examiner* — David Vu
*Assistant Examiner* — Mouloucoulaye Inoussa
(74) *Attorney, Agent, or Firm* — McDermott Will & Emery LLP

(57) ABSTRACT

There is provided an insulated gate bipolar transistor including: a first semiconductor area of a first conductivity type; a second semiconductor area of a second conductivity type formed on one surface of the first semiconductor area; third semiconductor areas of the first conductivity type continuously formed in a length direction on one surface of the second semiconductor area; a plurality of trenches formed between the third semiconductor areas, extending to an inside of the second semiconductor area, and being continuous in the length direction; a fourth semiconductor area of the second conductivity type formed on one surface of the third semiconductor areas, insulation layers formed inside the trenches; gate electrodes buried inside the insulation layers; and a barrier layer formed in at least one of locations corresponding to the third semiconductor areas inside the second semiconductor area.

9 Claims, 6 Drawing Sheets

(56) References Cited

U.S. PATENT DOCUMENTS

| | | | |
|---|---|---|---|
| 2007/0194375 A1* | 8/2007 | Kawaguchi et al. | 257/330 |
| 2010/0289076 A1* | 11/2010 | Nishida | H01L 29/0696 257/334 |
| 2011/0101417 A1* | 5/2011 | Ogura | H01L 29/0834 257/139 |

FOREIGN PATENT DOCUMENTS

| | | |
|---|---|---|
| JP | 9-331063 A | 12/1997 |
| JP | 2009-130075 A | 6/2009 |
| JP | 2009-152465 A | 7/2009 |

\* cited by examiner

INSULATED GATE BIPOLAR TRANSISTOR

CROSS-REFERENCE TO RELATED APPLICATIONS

This application claims the priority of Korean Patent Application No. 10-2012-0132534 filed on Nov. 21, 2012, in the Korean Intellectual Property Office, the disclosure of which is incorporated herein by reference.

BACKGROUND OF THE INVENTION

1. Field of the Invention

The present invention relates to an insulated gate bipolar transistor having high current density and a reduced on-voltage.

2. Description of the Related Art

Low power consumption power conversion apparatuses have recently been promoted. Thus, research into low power consumption by a power semiconductor device that performs a central role in the power conversion apparatus has been actively undertaken.

In particular, among power semiconductor devices, research into an insulated gate bipolar transistor (IGBT) is actively ongoing, since an IGBT can achieve low on-voltage according to a conductivity modulation effect and can be easily controlled owing to a voltage-driven gate.

Types of IGBT include a planar IGBT, a trench IGBT, and others. A planar IGBT has a structure in which gate electrodes are formed on a wafer surface. A trench IGBT has a structure in which an oxide film is interposed in trenches formed vertically downward from a wafer surface and gate electrodes are buried therein.

A trench IGBT includes channels formed in both inner walls of the trenches, which may increase channel density as compared to the case of a planar IGBT. Thus, the trench IGBT can further reduce an on-voltage.

The structure of a conventional trench IGBT may include an n− type low concentration silicon substrate that is a drift layer, an n type field stop layer formed in one surface of the n− type drift layer, and a relatively high concentration p type thin collector layer formed in one surface of the field stop layer in which an amount of impurities is controlled.

A plurality of p type base areas are formed in the other surface of the n− type drift layer. Surfaces of the p type base areas have n+ type emitter areas selectively formed thereon.

The trench is formed from the n+ type emitter area to the n− type drift layer through the p type base area. The gate electrode formed of conductive polycrystalline silicon is formed inside the trench having a gate oxide layer therebetween.

An interlayer insulation layer coated on an upper portion of the trench insulates an emitter electrode and the gate electrode.

The emitter electrode formed on an upper portion of the interlayer insulation layer is formed commonly conducting and contacting the n+ type emitter area and the p type base area by using an aperture window installed in the interlayer insulation layer.

A collector electrode is installed in a rear surface of the p type collector layer.

To allow the trench IGBT to be on-state, a voltage higher than a threshold voltage needs to be applied to the gate electrode in a state in which a voltage applied to the collector electrode is higher than a voltage applied to the emitter electrode.

Charges are accumulated in the gate electrodes by the above-described voltage and an n type inverted channel is concurrently formed in a surface of the p type base area side facing the gate oxide layer interposed between the gate electrodes.

Electrons are injected into the n− type drift layer from the n+ type emitter area through the n channel. The injected electrons make collector bonding forward biased, holes are injected from the p type collector layer, and thus the trench IGBT becomes the on-state.

A voltage drop value between the collector electrode and the emitter electrode in the on-state is equal to an on-voltage.

To change the IGBT from the on-state to an off-state, the voltage of the gate electrode needs to be below a threshold value.

Through the change in states, the charges accumulated in the gate electrodes are discharged to a gate driving circuit through a gate resistor. In this regard, since the n type inverted channel area is converted into a p type area, a path of the electrons disappears, resulting in no electron supply to the n− type drift layer. Accordingly, hole injection from the collector layer is not made, and thus, the electrons and the holes accumulated in the n− type drift layer are discharged to the collector electrode and the emitter electrode, respectively, or are re-coupled to each other. Thus, current is extinguished, and the IGBT becomes the off-state.

A variety of attempts have been made to increase a current density of the trench IGBT and further reduce the on-voltage. Conventionally, performance enhancement of the IGBT has been promoted by mainly adjusting a trench space of the IGBT.

However, narrowing of the trench space is restricted due to limited photo processing. Thus, a new method, other than the method of narrowing the trench space needs to be proposed.

RELATED ART DOCUMENT (Patent Document 1) Japanese Patent Laid-Open Publication No. 1994-188423.

SUMMARY OF THE INVENTION

An aspect of the present invention provides an insulated gate bipolar transistor having high current density and reduced on-voltage.

According to an aspect of the present invention, there is provided an insulated gate bipolar transistor including: a first semiconductor area of a first conductivity type; a second semiconductor area of a second conductivity type formed on one surface of the first semiconductor area; third semiconductor areas of the first conductivity type continuously formed in a length direction on one surface of the second semiconductor area; a plurality of trenches formed between the third semiconductor areas, extending to an inside of the second semiconductor area, and being continuous in the length direction; a fourth semiconductor area of the second conductivity type formed on one surface of the third semiconductor areas, insulation layers formed inside the trenches; gate electrodes buried inside the insulation layers; and a barrier layer formed in at least one of locations corresponding to the third semiconductor areas inside the second semiconductor area.

The barrier layer may be formed between an area corresponding to 5 μm apart from lower surfaces of the trenches in a thickness direction and the third semiconductor areas.

A width of the barrier layer may be smaller than a space between the trenches in a width direction.

The barrier layer may be formed in the at least one of locations corresponding to the third semiconductor areas, except for a location corresponding to the fourth semiconductor area.

The second semiconductor area may include a buffer layer of the second conductivity type contacting the first semiconductor area, and an impurity concentration of the buffer layer may be higher than that of the second semiconductor area.

The insulated gate bipolar transistor may further include an emitter electrode commonly ohmic-contacting the third semiconductor areas and the fourth semiconductor area, and a collector electrode ohmic-contacting the other surface of the first semiconductor area.

The trenches may have a continuous stripe shape in the length direction.

An impurity concentration of the fourth semiconductor area may be higher than that of the second semiconductor area.

According to another aspect of the present invention, there is provided an insulated gate bipolar transistor including: a first semiconductor area of a first conductivity type; a second semiconductor area of a second conductivity type formed on one surface of the first semiconductor area; third semiconductor areas of the first conductivity type continuously formed in a length direction on one surface of the second semiconductor area; a plurality of trenches formed between the third semiconductor areas, extending to an inside of the second semiconductor area, and being continuous in the length direction; a fourth semiconductor area of the second conductivity type formed on one surface of the third semiconductor areas, insulation layers formed inside the trenches; gate electrodes buried inside the insulation layers; and a barrier layer formed between the trenches inside the second semiconductor area.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
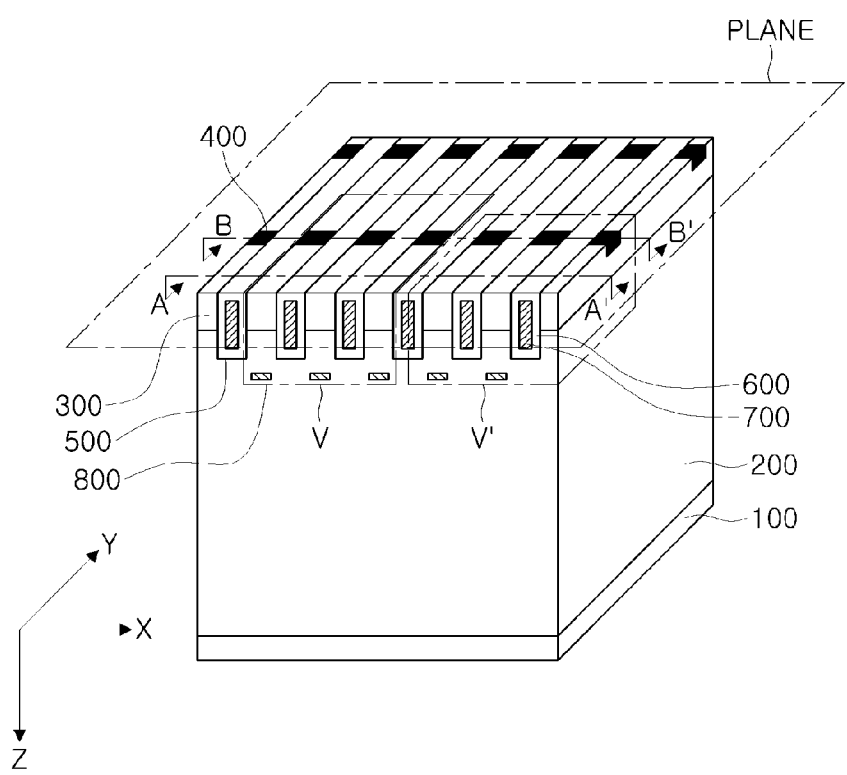
FIG. 1 is a schematic perspective view of an insulated gate bipolar transistor according to an embodiment of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

FIG. 1 is a schematic perspective view of an insulated gate bipolar transistor according to an embodiment of the present invention.

Figure 2A:
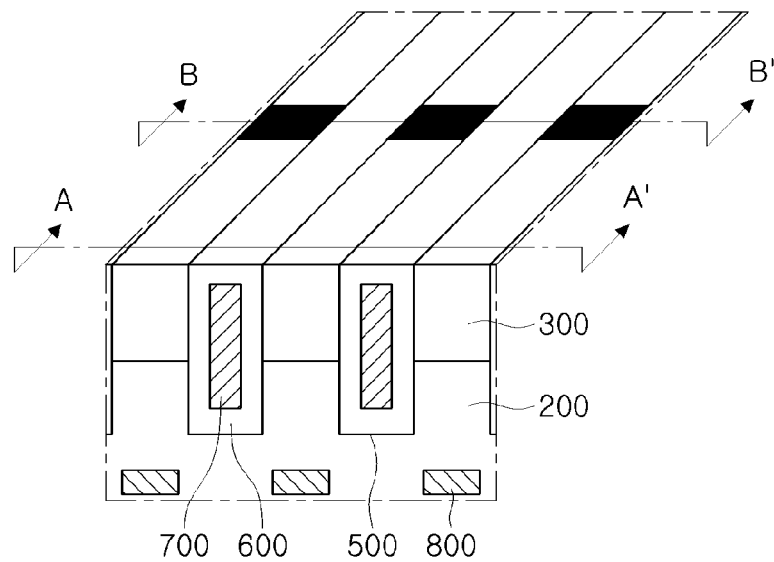
FIG. 2A is an enlarged view of area v of FIG. 1.

FIG. 2A is an enlarged view of area v of FIG. 1.

Figure 2B:
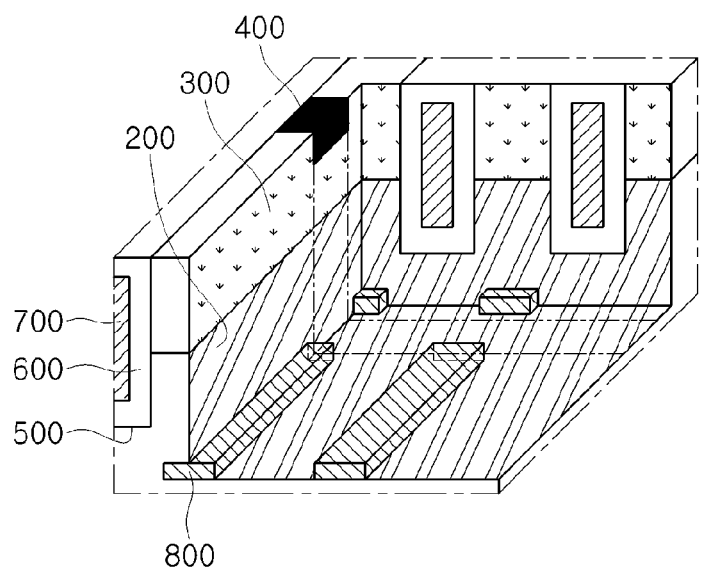
FIG. 2B is an enlarged cut perspective view of area v' of FIG. 1.

FIG. 2B is an enlarged cut perspective view of area v' of FIG. 1.

To clearly explain the present invention, directions of the insulated gate bipolar transistor are defined such that y, x, and z of FIG. 1 respectively indicate a length direction, a width direction, and a thickness direction. In this regard, the thickness direction may be used to have the same meaning as a stacking direction of semiconductor areas.

Referring to FIGS. 1, 2A, and 2B, an n− type drift layer 200 may be formed on a p type collector area 100 used as a collector area.

A p type well area 300 may be formed on an upper surface of the n− type drift layer 200.

The p type well area 300 may be continuously formed on one surface of the n− type drift layer 200 in a length direction. An n+ type source area 400 may be formed on a portion of an upper surface of the p type well area 300.

In a case in which the n+ type source area 400 is plural, the n+ type source areas 400 may be formed on the upper surface of the p type well area 300 to be spaced apart from each other by a predetermined interval in the length direction.

A plurality of trenches 500 may be formed to pass through the p type well area 300 in a thickness direction to extend to the inside of the n− type drift layer 200.

That is, the plurality of trenches 500 may be formed between the plurality of p type well areas 300 to extend to the inside of the n− type drift layer 200 and have a continuous stripe shape in the length direction.

A thin gate insulation layer 600 may be formed on inner walls of the trenches 500. A gate electrode 700 may be formed to be buried in the gate insulation layer 600.

A barrier layer 800 may be formed inside the n− type drift layer 200.

Meanwhile, an emitter electrode that commonly ohmic-contacts the p type well area 300, the p type well area 300 in the surface of the n+ type source areas 400, and the n+ type source area 400 may be formed.

A collector electrode that ohmic-contacts one surface of the p type collector area 100 may be formed.

Meanwhile, an upper plane of the insulated gate bipolar transistor of FIG. 1 is defined as an IGBT upper plane.

Meanwhile, the collector area 100, the drift layer 200, the well area 300, and the source area 400 used herein may be defined as a first semiconductor area, a second semiconductor area, a third semiconductor area, and a fourth semiconductor area, respectively.

Also, the p type and the n type used herein may be defined as a first conductivity type and a second conductivity type, respectively.

Further, in general, "+" means a state doped at a high concentration, and "−" means a state doped at a low concentration.

With respect to the above-described insulated gate bipolar transistor (IGBT), a channel area is formed in side wall portions of the trench 500 inside the p type well area 300. That is, if a voltage higher than a threshold voltage is applied to the gate electrode 700, a conductivity type of the side wall portions of the trench 500 inside the p type well area 300 is inverted so that a channel is formed, and an electron current flows from the n+ type source area 400 to the n− type drift layer 200 through the channel.

The electron current functions as a base current of a transistor formed by the p type well area 300, the n− type drift layer 200, and the p type collector area 100. A hole current corresponding to the base current flows from the p type collector area 100 through the n− type drift layer 200 and the p type well area 300 to the emitter electrode.

A potential barrier experienced by holes injected from the p type collector area 100 is formed by the barrier layer 800, and a conductivity modulation effect increases by increasing an accumulation of holes around the barrier layer 800.

Figure 3A:
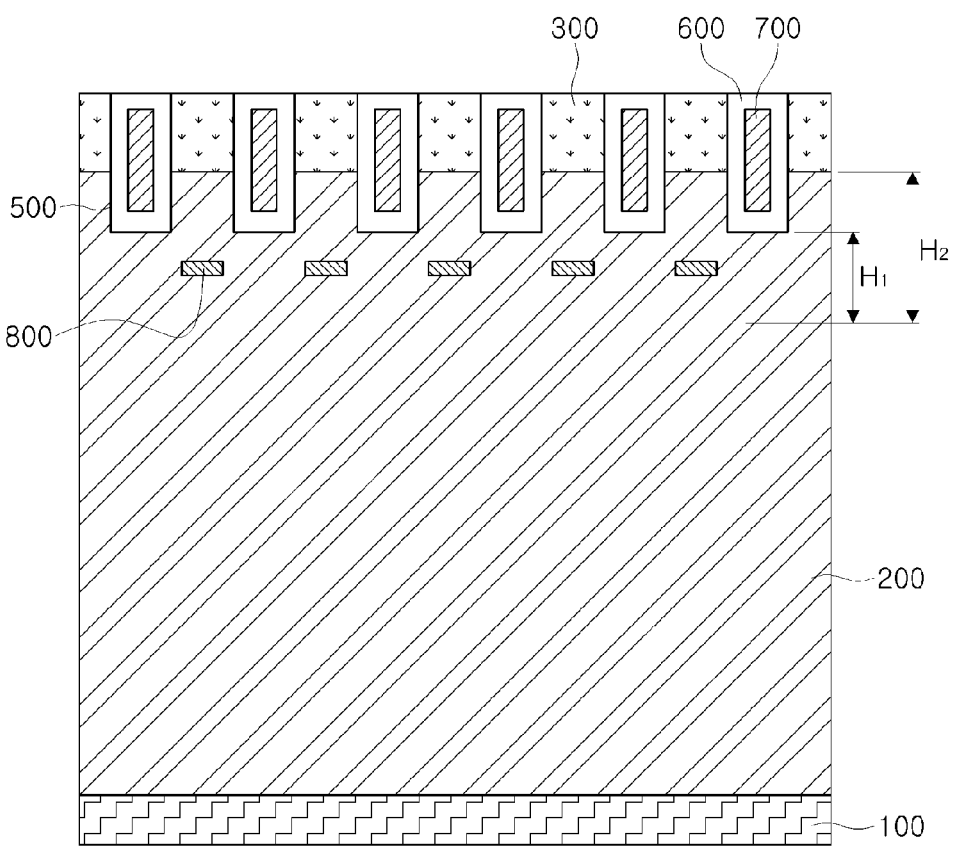
FIG. 3A is a cross-sectional view taken along line A-A' of FIG. 1.
Figure 3B:
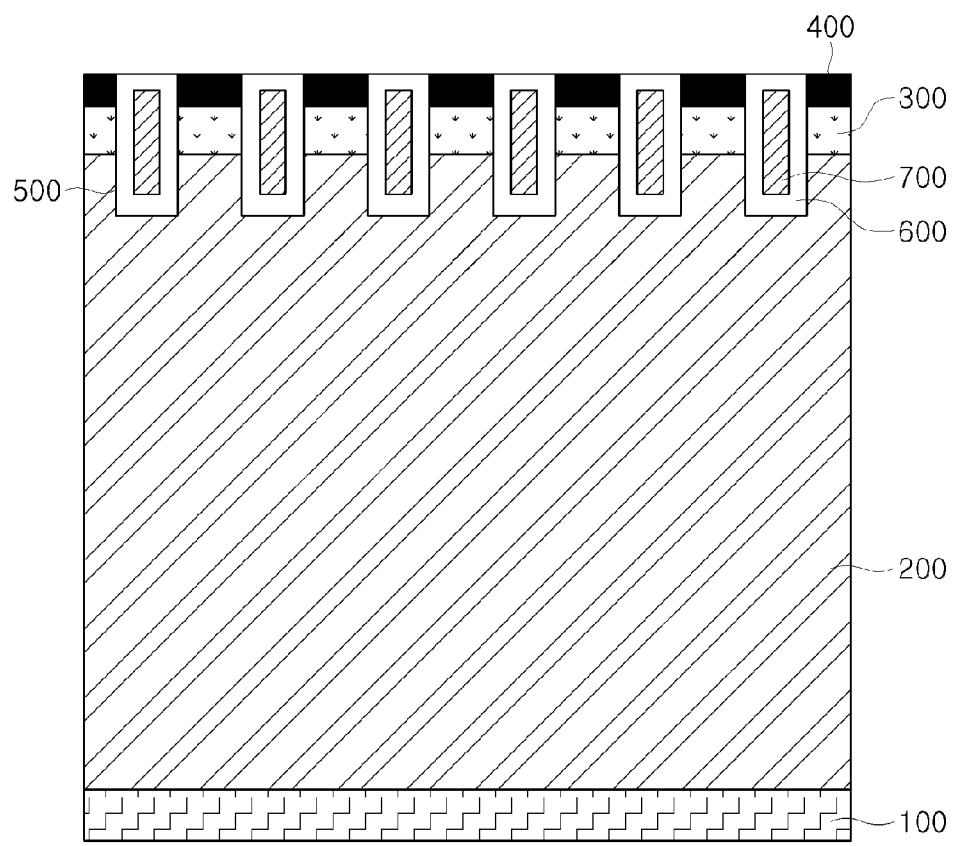
FIG. 3B is a cross-sectional view taken along line B-B' of FIG. 1.
Figure 4:
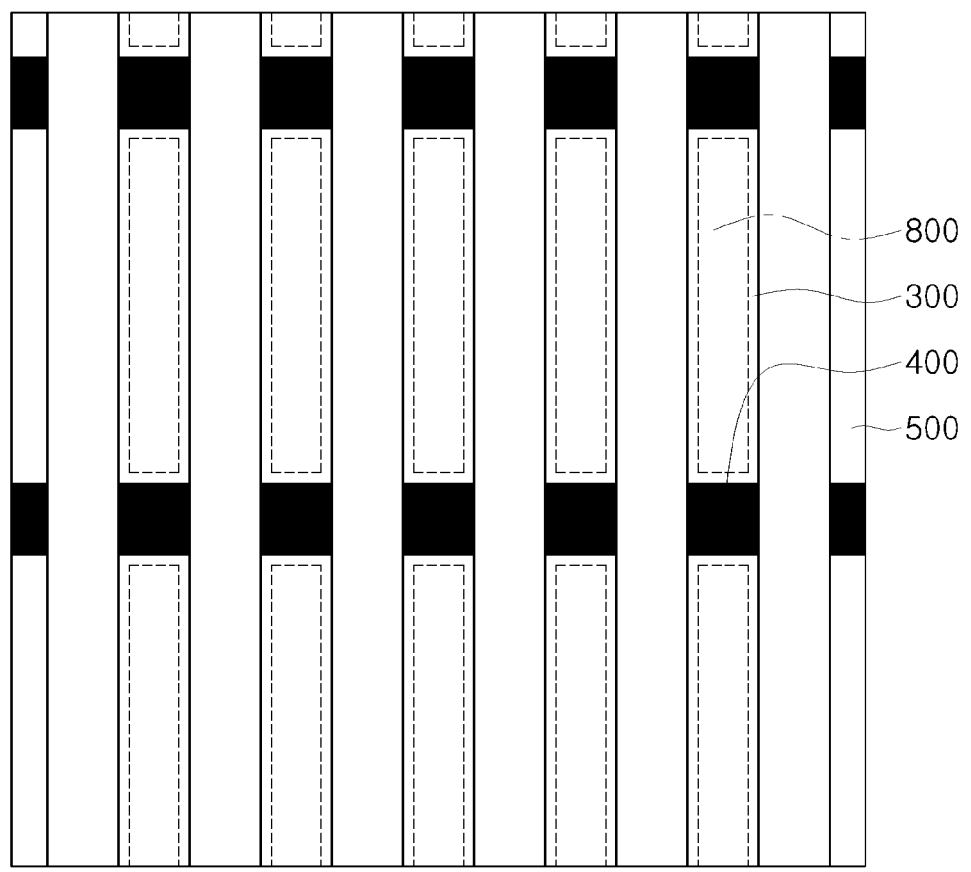
FIG. 4 is a plan view of FIG. 1.

FIGS. 3A and 3B are cross-sectional views taken along line A-A' and line B-B' of FIG. 1, respectively. FIG. 4 is a plan view of FIG. 1.

As shown in FIGS. 3A, 3B, and 4, the barrier layer 800 may not be continuously formed in the length direction and may be formed under a portion of the p type well area 300 on which the n+ type source area 400 is not formed. That is, since the n+ type source area 400 is a channel area for transferring an electron current, the barrier layer 800 is not formed in a location corresponding to the upper portion of the p type well area 300 having the n+ type source area 400 formed thereon, in the length direction, in order to allow the barrier layer 800 not to interrupt a transfer path of the electron current.

In other words, the barrier layer 800 does not exist in a location in which the n+ type source area 400 is formed on the upper plane.

The barrier layer 800 is formed in a location corresponding to the p type well area 300 inside the n− type drift layer 200 in the width direction. That is, the barrier layer 800 is disposed between the plurality of trenches 500 that are adjacent in the width direction.

Also, in a case in which the holes formed in a lower portion of the barrier layer 800 fail to escape to the emitter electrode by the barrier layer 800, the IGBT may be damaged by a latch-up operation due to a parasitic pnpn structure of the IGBT. Thus, a width of the barrier layer 800 may be smaller than a space between the trenches 500 in the width direction so that some holes can escape from a hole accumulation area formed in the lower portion of the barrier layer 800 to the emitter electrode.

Furthermore, the channel is formed in the side wall portions of the trenches 500, and the electron current flows from the n+ type source area 400 to the n− type drift layer 200 through the channel, and thus the width of the barrier layer 800 may be smaller than the space between the trenches 500 in the width direction in order not to interrupt an electron current flow.

Also, the barrier layer 800 may be disposed between an area corresponding to 5 μm apart from lower surfaces of the trenches 500 in the thickness direction and the p type well area 300. In other words, the barrier layer 800 may be disposed within a thickness range H2 from a boundary of the p type well area 300 and the n− type drift layer 200 to H1 that is within 5 μm apart from the lower surfaces of the trenches 500.

In a case in which the barrier layer 800 is disposed too far from the trenches 500, spreading of the electron current that starts being generated from the lower portions of the trenches 500 may be interrupted. That is, in a case in which the barrier layer 800 is disposed more than 5 μm apart from the lower surfaces of the trenches 500, this is analyzed as an additional resistance component in the electron current spreading phenomenon, resulting in lowering a voltage of a device.

The barrier layer 800 may be formed by injecting oxygen ions to the n− type drift layer 200 and oxidizing the n− type drift layer 200.

Also, an n type buffer layer may be further formed between the n− type drift layer 200 and the p type collector area 100.

The buffer layer may provide a field stop function. Thus, as compared with an IGBT having no buffer layer, the IGBT according to the present embodiment may allow the n− type drift layer 200 to be thin in the same internal pressure condition.

Figure 5:
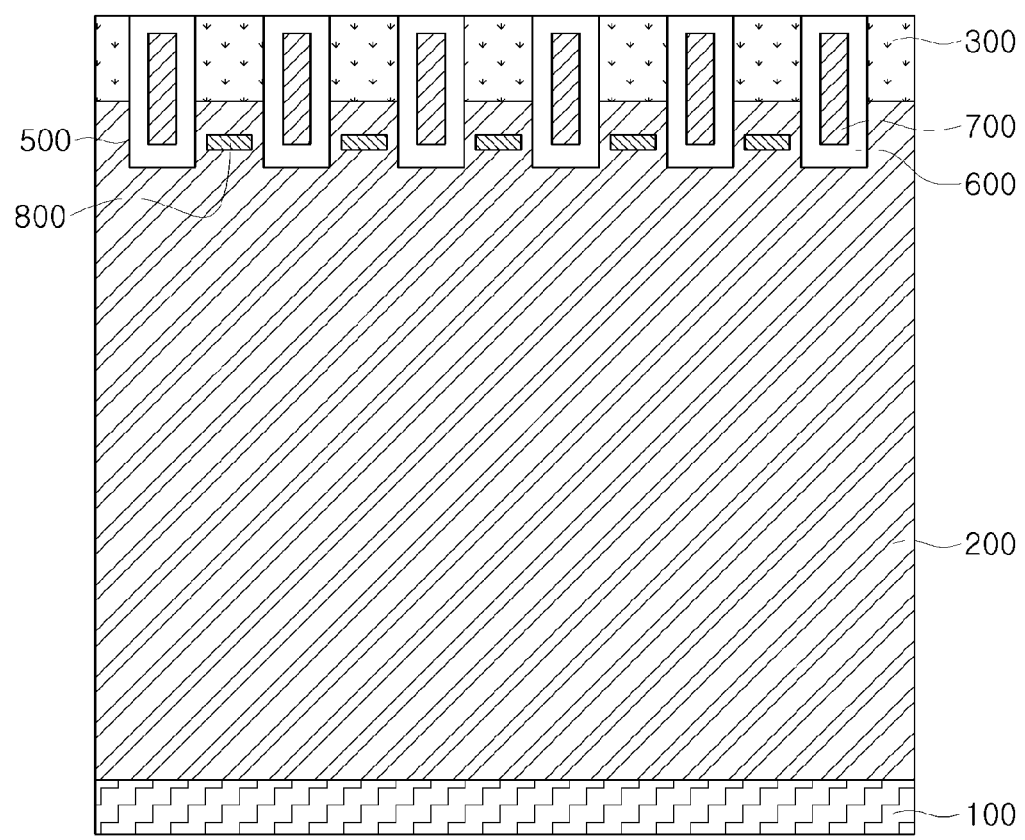
FIG. 5 is a schematic cross-sectional view of an insulated gate bipolar transistor according to an embodiment of the present invention.

According to the embodiment of the present invention, the barrier layer 800 may be formed between the adjacent trenches 500 as shown in FIG. 5.

The insulated gate bipolar transistor according to the embodiment of the present invention may increase a conductivity modulation phenomenon owing to the barrier layer 800 inside the n− type drift layer 200, thereby enhancing a current density of the IGBT and further reducing an on-voltage.

As set forth above, according to embodiments of the invention, an insulated gate bipolar transistor can increase current density and reduce an on-voltage.

While the present invention has been shown and described in connection with the embodiments, it will be apparent to those skilled in the art that modifications and variations can be made without departing from the spirit and scope of the invention as defined by the appended claims.

What is claimed is:

1. An insulated gate bipolar transistor comprising:
a first semiconductor area of a first conductivity type;
a second semiconductor area of a second conductivity type formed on one surface of the first semiconductor area;
third semiconductor areas of the first conductivity type continuously formed in a length direction on one surface of the second semiconductor area;
a plurality of trenches formed between the third semiconductor areas, extending to an inside of the second semiconductor area, and being continuous in the length direction;
a fourth semiconductor area of the second conductivity type formed on one surface of the third semiconductor areas spaced apart from each other at predetermined intervals in the length direction;
insulation layers formed inside the trenches;
gate electrodes buried inside the insulation layers; and
a barrier layer formed in locations corresponding to the third semiconductor areas inside the second semiconductor area,
wherein the barrier layer is an oxide, and
wherein the barrier layer is formed between an area corresponding to 5 μm apart from lower surfaces of the trenches in a thickness direction and the lower surfaces of the trenches.

2. The insulated gate bipolar transistor of claim 1, wherein a width of the barrier layer is smaller than a space between the trenches in a width direction.

3. The insulated gate bipolar transistor of claim 1, wherein the barrier layer is formed in the at least one of locations corresponding to the third semiconductor areas, except for a location corresponding to the fourth semiconductor area.

4. The insulated gate bipolar transistor of claim 1, wherein the second semiconductor area includes a buffer layer of the second conductivity type contacting the first semiconductor area, and
an impurity concentration of the buffer layer is higher than that of the second semiconductor area.

5. The insulated gate bipolar transistor of claim 1, further comprising an emitter electrode commonly ohmic-contacting the third semiconductor areas and the fourth semiconductor area.

6. The semiconductor device of claim 1, further comprising a collector electrode ohmic-contacting the other surface of the first semiconductor area.

7. The insulated gate bipolar transistor of claim 1, wherein an impurity concentration of the fourth semiconductor area is higher than that of the second semiconductor area.

8. The insulated gate bipolar transistor of claim 1, wherein the trenches have a continuous stripe shape in the length direction.

9. An insulated gate bipolar transistor comprising:
a first semiconductor area of a first conductivity type;
a second semiconductor area of a second conductivity type formed on one surface of the first semiconductor area;
third semiconductor areas of the first conductivity type continuously formed in a length direction on one surface of the second semiconductor area;
a plurality of trenches formed between the third semiconductor areas, extending to an inside of the second semiconductor area, and being continuous in the length direction;
a fourth semiconductor area of the second conductivity type formed on one surface of the third semiconductor areas spaced apart from each other at predetermined intervals in the length direction;
insulation layers formed inside the trenches;
gate electrodes buried inside the insulation layers; and
a barrier layer formed in locations corresponding to the third semiconductor areas inside the second semiconductor area,
wherein the barrier layer and the fourth semiconductor area are formed in a location between the same trenches, and the barrier layer is not formed in a location corresponding to that of the fourth semiconductor area.

* * * * *